US012740179B2

(12) United States Patent
Jung et al.

(10) Patent No.: US 12,740,179 B2
(45) Date of Patent: Sep. 15, 2026

(54) PRESSING DEVICE AND TABBING APPARATUS INCLUDING THE SAME

(71) Applicant: HANWHA SOLUTIONS CORPORATION, Seoul (KR)

(72) Inventors: Min Kyo Jung, Seoul (KR); Dong Heon Baek, Seoul (KR); Dong Jin Chung, Seoul (KR)

(73) Assignee: Hanwha Solutions Corporation, Seoul (KR)

(*) Notice: Subject to any disclaimer, the term of this patent is extended or adjusted under 35 U.S.C. 154(b) by 0 days.

(21) Appl. No.: 19/059,483

(22) Filed: Feb. 21, 2025

(65) Prior Publication Data

US 2025/0275286 A1 Aug. 28, 2025

(30) Foreign Application Priority Data

Feb. 22, 2024 (KR) ........................ 10-2024-0025912

(51) Int. Cl.
*H10F 71/00* (2025.01)
*B23K 1/00* (2006.01)
*B23K 101/36* (2006.01)

(52) U.S. Cl.
CPC ....... *H10F 71/1375* (2025.01); *B23K 1/0008* (2013.01); *B23K 2101/36* (2018.08)

(58) Field of Classification Search
None
See application file for complete search history.

(56) References Cited

U.S. PATENT DOCUMENTS 6,369,316 B1 * 4/2002 Plessing ............ B32B 17/10018 438/66
6,841,728 B2 * 1/2005 Jones .................. H10F 71/1375 29/730
7,998,760 B2 * 8/2011 Tabe ................... H10F 71/1375 438/66
8,024,854 B2 * 9/2011 Lu ..................... H01L 21/67721 29/564
2008/0061111 A1 * 3/2008 Kiriyama ............ H10F 71/1375 228/47.1

(Continued)

FOREIGN PATENT DOCUMENTS

CN 207852642 U * 9/2018
CN 217799467 U 11/2022

(Continued)

OTHER PUBLICATIONS

Search Report for European Application No. 25159013.9 dated Jul. 30, 2025.

(Continued)

*Primary Examiner* — Devang R Patel
(74) *Attorney, Agent, or Firm* — Harness, Dickey & Pierce, P.L.C.

(57) ABSTRACT

The present disclosure relates to a pressing device and a tabbing apparatus including the same, and the pressing device includes a first pressing member configured to press a first portion of a wire seated on a first surface of a solar cell and a second pressing member spaced apart from the first pressing member and configured to press a second portion of the wire seated on a second surface opposite to the first surface.

14 Claims, 15 Drawing Sheets

(56) References Cited

U.S. PATENT DOCUMENTS

| | | | | |
|---|---|---|---|---|
| 2010/0240166 | A1* | 9/2010 | Ishii | H10F 19/906<br>257/E21.499 |
| 2013/0237000 | A1 | 9/2013 | Tabe et al. | |
| 2015/0048078 | A1 | 2/2015 | Morf et al. | |

FOREIGN PATENT DOCUMENTS

| | | | | | |
|---|---|---|---|---|---|
| CN | 115832114 | A | | 3/2023 | |
| EP | 2269757 | A1 | | 1/2011 | |
| KR | 101058399 | B1 | | 8/2011 | |
| KR | 101305087 | B1 | * | 9/2013 | H10F 19/00 |
| KR | 101530035 | B1 | * | 6/2015 | H10F 71/00 |
| KR | 2016-0049566 | A | | 5/2016 | |

OTHER PUBLICATIONS

Office Action for Korean Application No. 10-2024-0025912 dated Nov. 19, 2025.

* cited by examiner 323
321a
324
322
321
322
324

PRESSING DEVICE AND TABBING APPARATUS INCLUDING THE SAME

CROSS-REFERENCE TO RELATED APPLICATION

This application claims priority to and the benefit of Korean Patent Application No. 10-2024-0025912, filed on Feb. 22, 2024, the disclosure of which is incorporated herein by reference in its entirety.

BACKGROUND

1. Field of the Invention

The present disclosure relates to a pressing device and a tabbing apparatus including the same, and more specifically, to a pressing device and a tabbing apparatus including the same, which allow a wire to be stably fixed to a solar cell.

2. Discussion of Related Art

In general, a solar cell is formed by arranging p-n junction diodes on a substrate. When a solar cell is irradiated with sunlight, an exciton, which is an electron-hole pair, is generated, and as the exciton separates, the electron moves to an n layer, the hole moves to a p layer, and thus photovoltaic power is generated at a p-n junction.

In general, since the maximum voltage generated by a single unit solar cell is only about 0.5 V, multiple solar cells need to be connected in series to be used. A module formed by connecting multiple unit solar cells in this way is called a solar cell module.

A tabbing process is a process of forming a single solar cell module by arranging wires on a plurality of solar cells and electrically connecting the plurality of solar cells.

Conventional cell-jig transfer devices need to perform two operations of first picking up one of a solar cell and a wire jig, seating it on a wire, and then returning it to its original position, and picking up the other and seating it on the wire. Accordingly, since it takes a lot of time to seat the solar cell and the wire jig on the wire, there is a problem that the entire process is delayed.

The background technology of the present disclosure is disclosed in Korean Patent Registration No. 10-1058399 (registered on Aug. 16, 2011, entitled “Tabber-stringer and tabbing-stringing method).

SUMMARY OF THE INVENTION

The present disclosure is directed to providing a pressing device and a tabbing apparatus including the same, which allow a wire to be stably fixed to a solar cell.

According to an aspect of the present disclosure, there is provided a pressing device including a first pressing member configured to press a first portion of a wire seated on a first surface of a solar cell, and a second pressing member spaced apart from the first pressing member and configured to press a second portion of the wire seated on a second surface opposite to the first surface.

The first pressing member may include a first pressing body disposed to face the first surface and a first pressing pin connected to the first pressing body and configured to press the first portion toward the first surface.

The first pressing member may further include a pressing groove which is concavely formed inward of the first pressing pin and into which the first portion is inserted.

A width of the pressing groove may increase toward the first surface.

The first pressing pin may be movably connected to the first pressing body. The first pressing member may further include an elastic member configured to elastically support the first pressing pin with respect to the first pressing body.

The second pressing member may include a second pressing body disposed to face the second surface and a second pressing pin connected to the second pressing body and configured to press the second portion toward the second surface.

A material of one of the first pressing pin and the second pressing pin may include a ceramic.

The second pressing pin may be disposed to face the first pressing pin.

The second pressing pin may be disposed to be misaligned with the first pressing pin, and the second pressing member may further include a support pin disposed to face the first pressing pin.

A cross-sectional area of the support pin may be smaller than a cross-sectional area of the second pressing pin.

The first pressing pin and the second pressing pin may be provided as a plurality of first pressing pins and a plurality of second pressing pins, and at least one of the plurality of second pressing pins may be disposed to be misaligned with the first pressing pin.

The second pressing pin may be movably connected to the second pressing body and may be brought into contact with or separated from the second portion according to a movement direction.

The second pressing member may further include a pressing driving unit which is connected to the second pressing pin and controls the movement direction of the second pressing pin.

The solar cell may be transferred to the second pressing member in a first direction parallel to an extending direction of the wire, and the pressing device may further include a third pressing member configured to press the second portion toward the second surface in conjunction with the transfer of the solar cell.

The third pressing member may include a third pressing body spaced apart from the second pressing member in a direction opposite to the first direction and disposed to face the second portion and a guide groove which is concavely formed inward of the third pressing body and disposed parallel to the first direction and into which the second portion is inserted.

A depth of the guide groove may decrease in the first direction.

According to another aspect of the present disclosure, there is provided a tabbing apparatus including a transfer line configured to transfer a solar cell, a bonding device configured to bond the solar cell transferred by the transfer line and a wire seated on the solar cell, and a pressing device configured to press the wire toward the solar cell, wherein the pressing device includes a first pressing member configured to press a first portion of the wire seated on a first surface of the solar cell, and a second pressing member spaced apart from the first pressing member and configured to press a second portion of the wire seated on a second surface opposite to the first surface.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIG. 16 is a schematic front cross-sectional view illustrating a configuration of a tabbing apparatus according to still another embodiment of the present disclosure;

FIG. 17 is a schematic side cross-sectional view illustrating the configuration of the tabbing apparatus according to still another embodiment of the present disclosure.

DETAILED DESCRIPTION OF EXEMPLARY EMBODIMENTS

Figure 1:
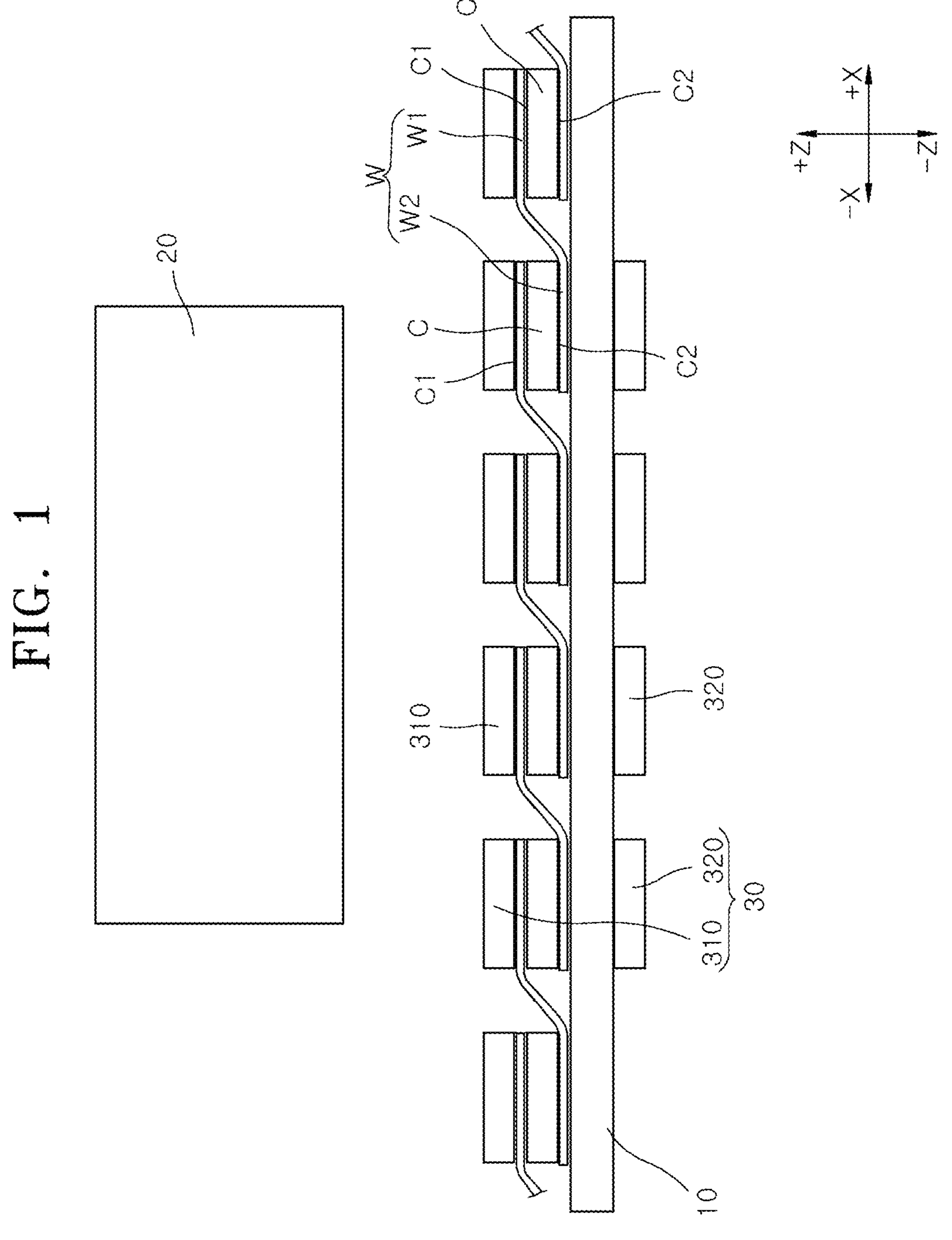
FIG. 1 is a schematic side view illustrating a configuration of a tabbing apparatus according to one embodiment of the present disclosure.

Hereinafter, embodiments of the present disclosure will be described, in detail, with reference to the accompanying drawings. Prior to this, terms or words used in this specification and claims should not be interpreted as limited to their usual or dictionary meanings and should be interpreted as meanings and concepts that conform to the technical idea of the present disclosure based on the principle that the inventor can appropriately define the concepts of the terms in order to describe his or her own invention in the best way. The embodiments described in this specification and the configurations shown in the drawings are only some embodiments of the present disclosure and do not represent all of the technical ideas of the present disclosure. Accordingly, it should be understood that there may be various equivalents and modifications that can replace them at the time of filing this application. In addition, when used in the present specification, "comprise" and "include" and/or "comprising" and "including" specify the presence of the stated shapes, numbers, steps, operations, members, elements, and/or groups thereof and do not preclude the presence or addition of one or more other shapes, numbers, operations, members, elements, and/or groups thereof. In addition, when embodiments of the present disclosure are described, "may" and "may be" may include "one or more embodiments of the present disclosure."

In addition, to facilitate understanding of the invention, the accompanying drawings are not drawn to scale, and the dimensions of some components may be shown in an exaggerated manner. In addition, the same reference numbers may denote the same components in different embodiments.

When two objects of comparison are "the same", it means that they are "substantially the same." Accordingly, "substantially the same" may include a deviation that is considered low in the art, for example, a deviation within 5%. In addition, uniformity of a parameter over a given region may mean uniformity from the viewpoint of an average.

Although "first," "second," etc. are used to describe various components, these components are not limited by these terms. These terms are used only to distinguish one component from another, and unless otherwise stated, it is obvious that a first component may be a second component.

Throughout the specification, unless otherwise stated, each element may be singular or plural.

When any component is disposed "above (or below)" or "on (or under)" a component, it may mean not only that any component is disposed in contact with an upper surface (or lower surface) of the component, but also that other components may be interposed between the component and any component disposed on (or under) the component.

In addition, when a certain component is described as being "connected," "coupled," or "joined" to another component, the components may be directly connected or joined, but it should be understood that another component may be "interposed" between the components, or the components may be "connected," "coupled," or "joined" through the other component. In addition, when a first component is described as being "electrically coupled to" a second component, this includes not only a case in which the first component is "directly coupled" to the second component, but also a case in which the first component is "coupled" to the second component with a third component interposed therebetween.

When referring to "A and/or B" throughout the specification, this means A, B or A and B unless otherwise specified. In other words, the term "and/or" includes all or any combination of the plurality of listed items. When referring to "C to D," this means C or more and D or less unless otherwise specified.

When phrases such as "at least one of A, B, and C, "at least one of A, B, or C," "at least one selected from a group of A, B, and C," and "at least one selected from among A, B, and C" are used to designate a list of elements A, B, and C, the phrase may refer to any and all suitable combinations thereof.

The term "use" may be considered synonymous with the term "utilize." As used herein, the terms "substantially," "about," and similar terms are used as terms of approximation and not as terms of degree and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be named a second element, component, region, layer, or section without departing from the teachings of example embodiments.

Spatially relative terms, such as "beneath," "below," "lower," "above," "upper," and the like, may be used herein for ease of description to describe a relationship of one element or feature to (an) other element(s) or feature(s) as illustrated in the drawings. It will be understood that the spatially relative terms are intended to encompass different orientations of the device in use or operation in addition to the orientations depicted in the drawings. For example, if a device in the drawings is turned over, elements described as "below" or "beneath" other elements would then be understood to be "above" or "over" the other elements. Thus, the term "below" may encompass both an orientation of above and below.

The terminology used herein is intended to describe embodiments of the present disclosure and is not intended to limit the present disclosure.

Figure 2:
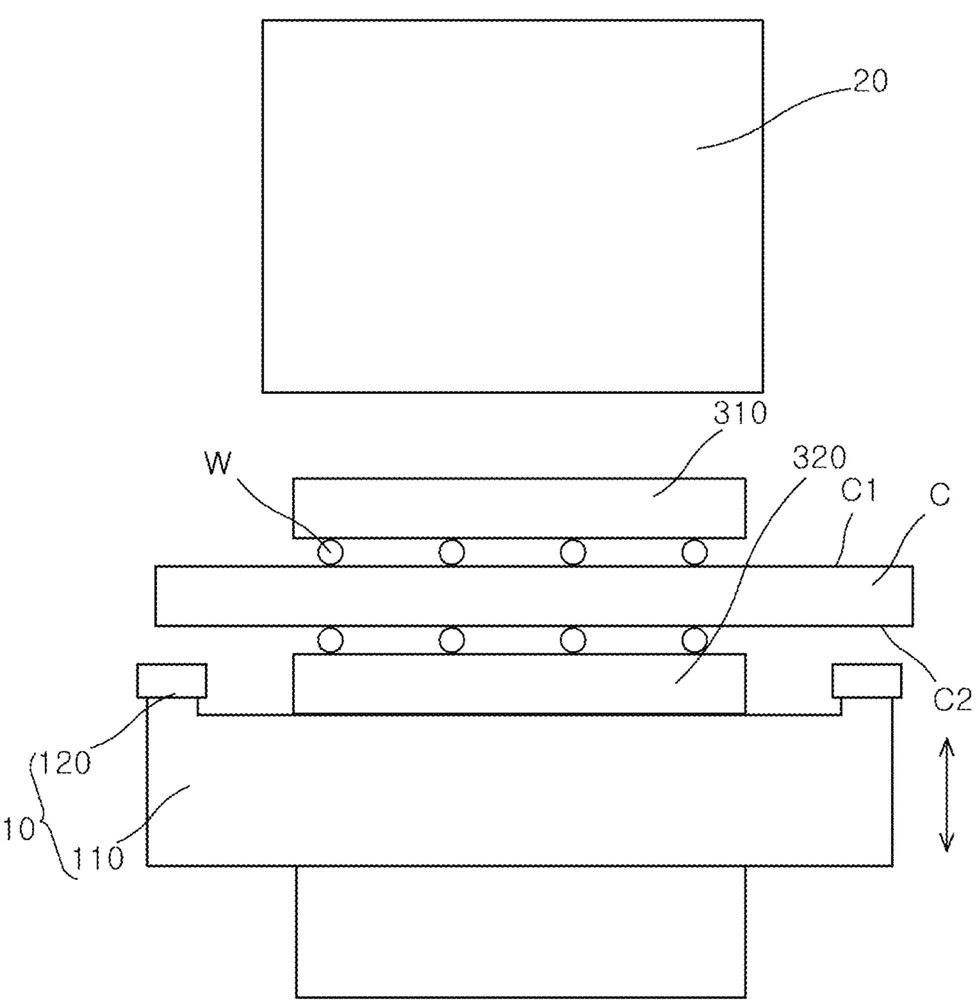
FIG. 2 is a schematic cross-sectional view illustrating the configuration of the tabbing apparatus according to one embodiment of the present disclosure.
Figure 2:
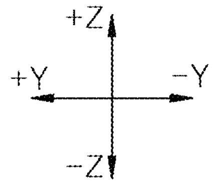

FIG. 1 is a schematic side view illustrating a configuration of a tabbing apparatus according to one embodiment of the present disclosure, and FIG. 2 is a schematic cross-sectional view illustrating the configuration of the tabbing apparatus according to one embodiment of the present disclosure.

Referring to FIGS. 1 and 2, the tabbing apparatus is an apparatus for connecting solar cells C to wires W to form a solar cell module and may include a transfer line 10, a bonding device 20, and a pressing device 30.

The transfer line 10 may transfer the solar cell C and the wire W. More specifically, the transfer line 10 may serve as a component for continuously transferring the solar cell C and the wire W in a first direction.

The solar cell C has a semiconductor junction area having a p-n junction surface, and when energy with a predetermined magnitude or more is radiated, an electromotive force may be generated to convert light energy into electrical energy. A material of a semiconductor included in the solar cell C is not particularly limited, and silicon (single crystalline, polycrystalline, or amorphous silicon), gallium arsenide, cadmium tellurium, cadmium sulfide, indium phosphide, copper indium gallium selenide (CIGS), an organic dye, or a mixture thereof may be used.

The solar cell C may be provided as a plurality of solar cells. The plurality of solar cells C may be arranged in the first direction. The first direction may be one of the directions parallel to the solar cell C. For example, the first direction may be a +X-axis direction based on FIG. 1.

The solar cell C may include a first surface C1 and a second surface C2 which are opposite to each other and parallel to the first direction. The first surface C1 and the second surface C2 may serve as a positive electrode and a negative electrode of the solar cell C, respectively. The first surface C1 and the second surface C2 may be spaced apart from each other in a second direction. Here, the second direction may be a direction intersecting the first direction and may be a +Z-axis direction based on FIG. 1.

The wire W may serve as a conductor for electrically connecting a plurality of solar cells C. The wire W may electrically connect a pair of solar cells C disposed adjacent to each other in a solar cell module.

A length of the wire W may extend in the first direction. Both sides of the wire W may be disposed to face a pair of neighboring solar cells C in the first direction, respectively. For example, the wire W may include a first portion W1 facing the first surface C1 of one of the neighboring solar cells C, and a second portion W2 facing the second surface C2 of the other.

The wire W may be provided as a plurality of wires. The plurality of wires W may be individually disposed between neighboring solar cells C.

A plurality of wires W may be disposed on one solar cell C in parallel in a third direction. Here, the third direction may be a direction intersecting the first direction and the second direction and may be a +Y-axis direction based on FIG. 1.

The wire W may be electrically connected to the solar cell C through a soldering process. In this case, the solar cell C and the wire W may be transferred in the first direction by the transfer line 10 in a state in which surfaces are coated with a flux. Alternatively, the wire W may be electrically connected to the solar cell C through an electrically conductive adhesive (ECA) curing process. In this case, the solar cell C and the wire W may be transferred in the first direction by the transfer line 10 in a state in which the surfaces are coated with an ECA.

The transfer line 10 according to the present embodiment may include a transfer body 110 and a transfer member 120.

The transfer body 110 may be disposed to face the second surface C2 of the solar cell C.

The transfer body 110 according to the present embodiment may be installed to reciprocate in a direction parallel to the first direction at a position spaced apart from the second surface C2 of the solar cell C. In this case, the transfer body 110 may be installed to reciprocate in a direction parallel to the second direction at the position spaced apart from the second surface C2 of the solar cell C. The transfer body 110 may be connected to a power device (not illustrated) such as a motor, a cylinder, or the like and may be moved in the direction parallel to the first direction and the second direction after receiving a driving force from the power device.

The transfer body 110 may circulate along a set path. For example, the transfer body 110 may sequentially move in the second direction, the first direction, a direction opposite to the second direction, and a direction opposite to the first direction.

The transfer member 120 may be connected to the transfer body 110 and may move the solar cell C and the wire W in the first direction in conjunction with the movement of the transfer body 110.

The transfer member 120 according to the present embodiment may extend from the transfer body 110 toward the second surface C2 of the solar cell C. A length of the transfer member 120 may extend in the direction parallel to the first direction. Accordingly, the transfer member 120 may be disposed to simultaneously face the second surfaces C2 of the plurality of solar cells C arranged in the first direction.

The transfer member 120 may come into contact with the second surface C2 as the transfer body 110 moves in the second direction. Thereafter, the transfer member 120 may move the solar cell C and the wire W in the first direction while in contact with the second surface C2 of the solar cell C as the transfer body 110 moves in the first direction. Thereafter, the transfer member 120 may be separated from the second surface C2 as the transfer body 110 moves in the direction opposite to the second direction. When the transfer member 120 moves in the direction opposite to the second direction, the solar cell C may be seated on the pressing device 30 or a separate support (not illustrated) to maintain a state of being spaced apart from the transfer member 120. Thereafter, as the transfer body 110 moves in the direction opposite to the first direction, the transfer member 120 may be returned to an initial position. Accordingly, the solar cell C and the wire W may move a movement distance of the transfer member 120 in the first direction in a stepwise manner at set time intervals.

The bonding device 20 may bond the solar cell C and the wire W which are transferred by the transfer line 10. For example, the bonding device 20 may include various types of heating devices for heating the solar cell C and the wire W which are transferred by the transfer line 10 to melt a solder layer of the wire W or curing an ECA with which a connecting portion of the solar cell C and the wire W is coated.

The bonding device 20 may operate alternately with the transfer line 10. For example, the bonding device 20 may heat the solar cell C and the wire W when the transfer member 120 is separated from the solar cell C and does not transfer the solar cell C and the wire W. In addition, the bonding device 20 may stop the heating operation for the solar cell C and the wire W when the transfer member 120 is in contact with the solar cell C and transfers the solar cell C and the wire W. However, the bonding device 20 is not limited to such an operation and may be configured to perform an operation independent of the transfer line 10.

The pressing device 30 may serve as a component for fixing a relative position of the wire W with respect to the solar cell C during the bonding process of the solar cell C and the wire W.

Figure 3:
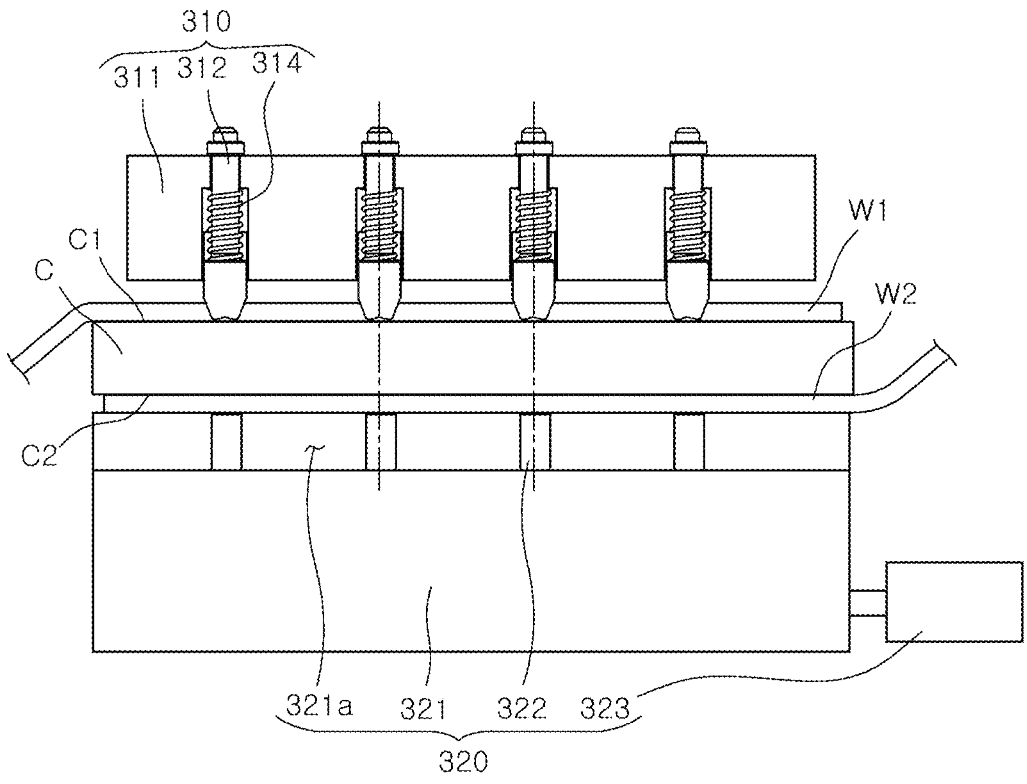
FIG. 3 is a schematic side cross-sectional view illustrating a configuration of a pressing member according to one embodiment of the present disclosure.
Figure 3:
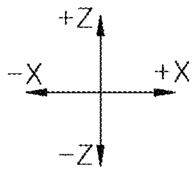
Figure 4:
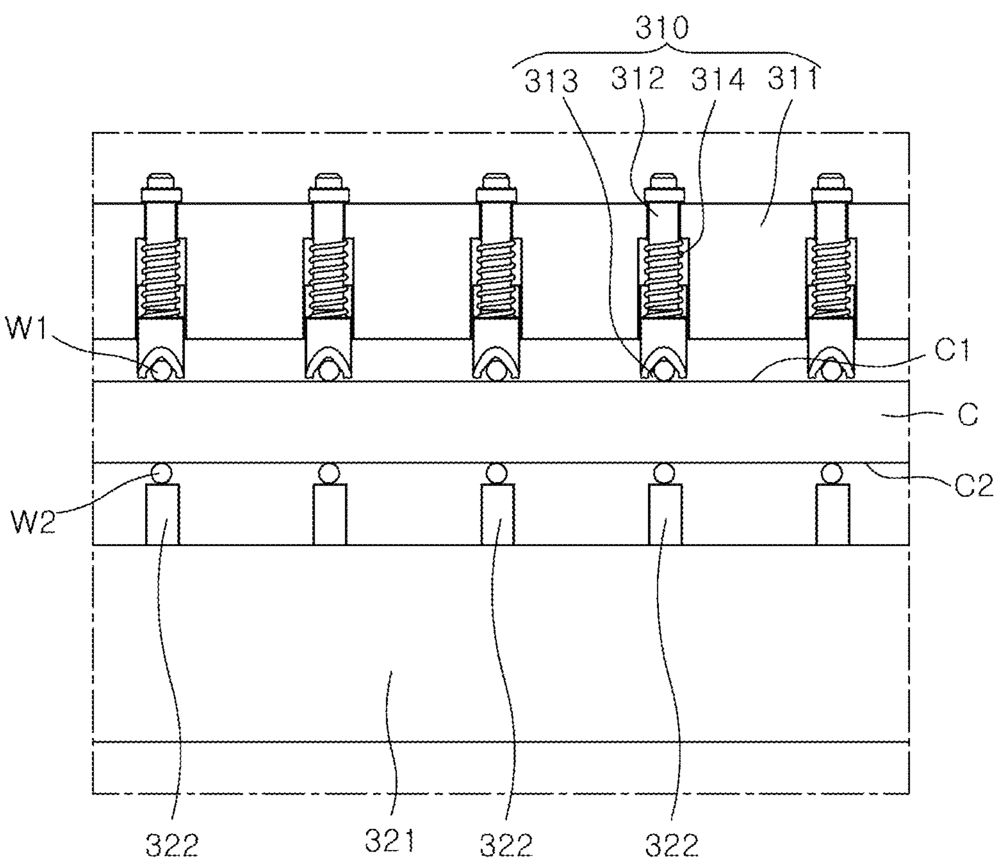
FIG. 4 is a schematic front cross-sectional view illustrating the configuration of the pressing member according to one embodiment of the present disclosure.
Figure 4:
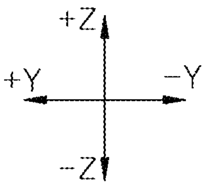

FIG. 3 is a schematic side cross-sectional view illustrating a configuration of a pressing member according to one embodiment of the present disclosure, and FIG. 4 is a schematic front cross-sectional view illustrating the configuration of the pressing member according to one embodiment of the present disclosure.

Referring to FIGS. 1 to 4, the pressing device 30 according to the present embodiment may include a first pressing member 310 and a second pressing member 320.

The first pressing member 310 may press the first portion W1 of the wire W seated on the first surface C1 of the solar cell C.

The first pressing member 310 may be provided as a plurality of first pressing members. Each first pressing member 310 may be individually disposed on the first surface C1 of a different solar cell C. The first pressing member 310 may move in the first direction along with the solar cell C when the solar cell C is moved by the transfer line 10.

Figure 5:
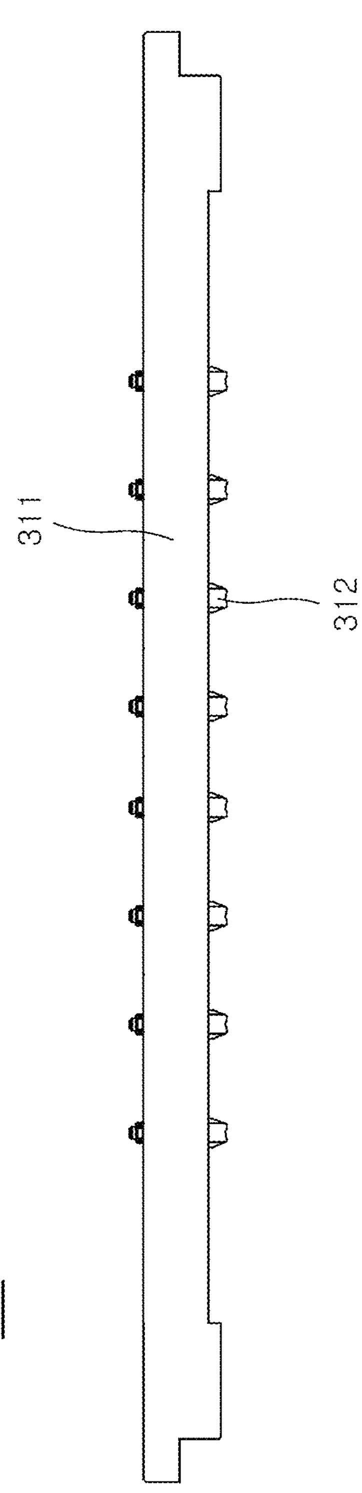
FIG. 5 is a schematic side view illustrating a configuration of a first pressing member according to one embodiment of the present disclosure.
Figure 6:
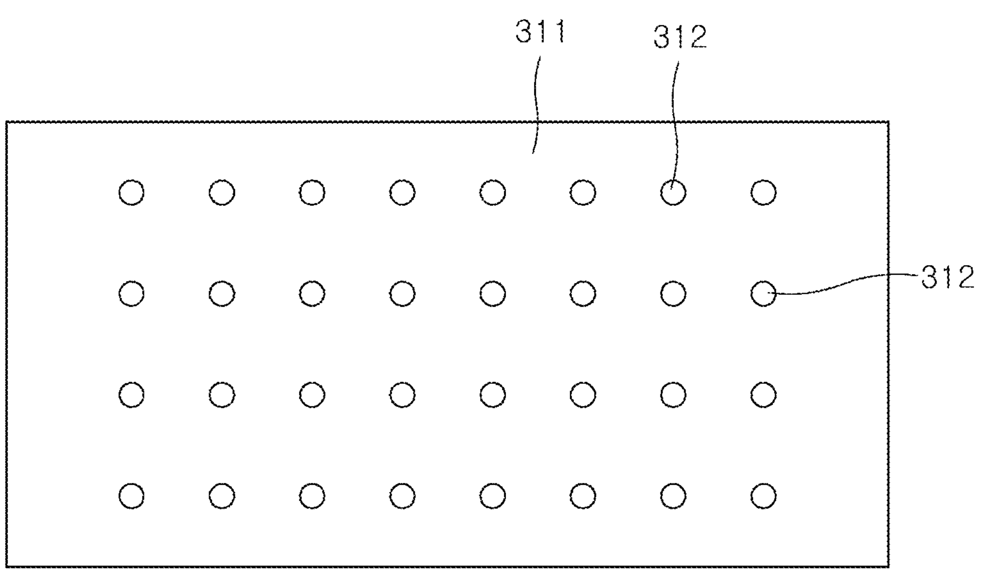
FIG. 6 is a schematic plan view illustrating the configuration of the first pressing member according to one embodiment of the present disclosure.
Figure 7:
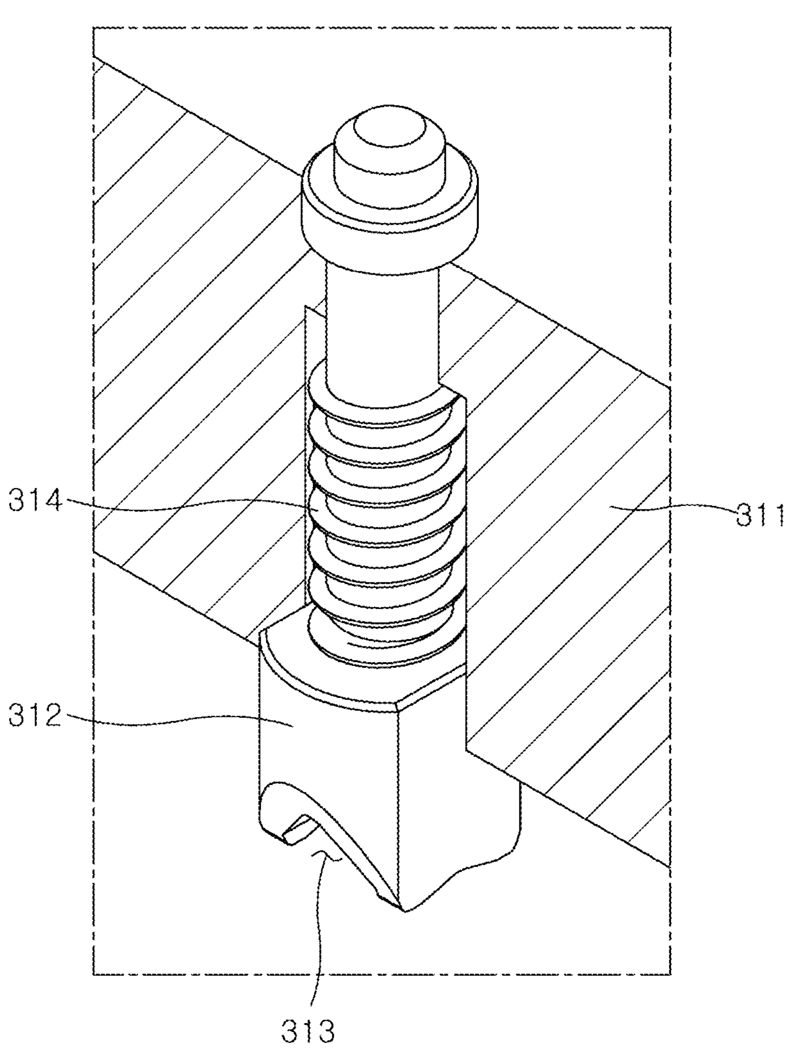
FIG. 7 is a schematic cross-sectional view illustrating the configuration of the first pressing member according to one embodiment of the present disclosure.

FIG. 5 is a schematic side view illustrating a configuration of a first pressing member according to one embodiment of the present disclosure, FIG. 6 is a schematic plan view illustrating the configuration of the first pressing member according to one embodiment of the present disclosure, and FIG. 7 is a schematic cross-sectional view illustrating the configuration of the first pressing member according to one embodiment of the present disclosure.

Referring to FIGS. 1 to 7, the first pressing member 310 according to the present embodiment may include a first pressing body 311 and a first pressing pin 312.

The first pressing body 311 may form an approximate exterior of the first pressing member 310 and support the first pressing pin 312.

The first pressing body 311 according to the present embodiment may be disposed to face the first surface C1 of the solar cell C. That is, the first pressing body 311 may be disposed at a position spaced apart from the first surface C1 of the solar cell C in the second direction.

The first pressing pin 312 may be connected to the first pressing body 311 and may press the first portion W1 of the wire W toward the first surface C1 of the solar cell C.

The first pressing pin 312 according to the present embodiment may have a rod shape protruding from the first pressing body 311 toward the first surface C1 of the solar cell C. A cross-sectional shape of the first pressing pin 312 may have various shapes such as a circle, an oval, a polygon, an irregular shape, and the like. A longitudinal direction of the first pressing pin 312 may be disposed parallel to the second direction. An end portion of the first pressing pin 312 may be in contact with the first portion W1 of the wire W, which faces the first surface C1 of the solar cell C. The first pressing pin 312 may press the first portion W1 of the wire W toward the first surface C1 of the solar cell C, that is, in the direction opposite to the second direction, by the weight of the first pressing body 311 or a separate pressing means.

A material of the first pressing pin 312 may include a ceramic having insulating properties. For example, the first pressing pin 312 may be entirely made of a ceramic. However, the first pressing pin 312 is not limited thereto and may be formed in a form in which only an end portion that comes into contact with the first portion W1 of the wire W is made of a ceramic or in a form in which a surface is coated with a ceramic. Accordingly, the first pressing pin 312 can prevent the wire W from being fused on the surface by heat applied from the bonding device 20.

The first pressing pin 312 may be provided as a plurality of first pressing pins. The plurality of first pressing pins 312 may individually press different positions of the first portion W1 of the wire W.

For example, the plurality of first pressing pins 312 may be arranged in two or more rows in an extending direction of the first portion W1, that is, the first direction. Accordingly, the plurality of first pressing pins 312 may firmly bring the first portion W1 of one wire W into close contact with the first surface C1 of the solar cell C.

The plurality of first pressing pins 312 may be arranged in two or more rows in a direction intersecting the extending direction of the first portion W1, that is, the third direction. Accordingly, the plurality of first pressing pins 312 may uniformly press the plurality of wires W disposed in parallel on the first surface C1 of the solar cell C.

The number and arrangement of plurality of first pressing pins 312 are not limited to those illustrated in FIGS. 4 and 5 and may be designed to vary depending on the size of the solar cell C, the number of wires W, and the like.

The first pressing member 310 according to the present embodiment may further include a pressing groove 313.

The pressing groove 313 may serve as a component for guiding the contact between the first pressing pin 312 and the first portion W1 of the wire W.

The pressing groove 313 according to the present embodiment may have a groove shape which is concavely formed from the end portion of the first pressing pin 312, which faces the first portion W1 of the wire W, inward of the first pressing pin 312. The pressing groove 313 may extend from the end portion of the first pressing pin 312 in the second direction. The pressing groove 313 may pass through both surfaces of the first pressing pin 312 perpendicular to the first direction. Accordingly, the first portion W1 of the wire W disposed parallel to the first direction may be inserted into the pressing groove 313 and come into contact with the first pressing pin 312.

The width of the pressing groove 313 parallel to the third direction may be formed to increase toward the first surface C1. The width of one end portion of the pressing groove 313, which is located at an end surface of the first pressing pin 312, may be larger than the diameter of the first portion W1 of the wire W. Accordingly, when the first pressing body 311 moves toward the first surface C1, the first portion W1 of the wire W may be smoothly inserted into the pressing groove 313. The width of the other end portion of the pressing groove 313, which is located inside the first pressing pin 312, may be smaller than the diameter of the first portion W1 of the wire W. Accordingly, after the first portion W1 of the wire W is inserted into the pressing groove 313, the first pressing pin 312 may firmly come into close contact with the first portion W1 of the wire W.

The first pressing pin 312 may be reciprocally connected to the first pressing body 311 in the direction parallel to the second direction. Accordingly, the first pressing pin 312 may move in the second direction when the first pressing pin 312 comes into contact with the first portion W1 of the wire W.

The first pressing member 310 according to the present embodiment may further include an elastic member 314.

The elastic member 314 may elastically support the first pressing pin 312 with respect to the first pressing body 311. Accordingly, when the first pressing pin 312 is moved in the second direction due to coming into contact with the first portion W1 of the wire W, the elastic member 314 may absorb an impact generated between the first pressing pin 312 and the first portion W1 of the wire W by its own elastic restoring force. In addition, the elastic member 314 may be firmly in close contact with the first portion W1 of the wire W, and when an external force acting on the first pressing pin 312 is removed, the elastic member 314 may return the first pressing pin 312 to the initial position.

The elastic member 314 according to the present embodiment may have the form of a coil spring which can be compressed or stretched in a longitudinal direction. A longitudinal direction of the elastic member 314 may be disposed parallel to the longitudinal direction of the first pressing pin 312, that is, the second direction. The elastic member 314 may have both end portions fixed to the first pressing body 311 and the first pressing pin 312, respectively. The elastic member 314 may be installed to constantly apply an elastic force to the first pressing pin 312 in the direction parallel to the second direction when no separate external force is applied to the first pressing pin 312.

The second pressing member 320 may be disposed to be spaced apart from the first pressing member 310. The second pressing member 320 may press the second portion W2 of the wire W seated on the second surface C2 of the solar cell C.

The second pressing member 320 may be positionally fixed without moving along with the solar cell C when the solar cell C is moved in the first direction by the transfer line 10. For example, the solar cell C and the wire W may be transferred to the second pressing member 320 in the first direction by the transfer line 10 in a state in which the first pressing member 310 is seated on the first portion W1.

The second pressing member 320 may be provided as a plurality of second pressing members. Each second pressing member 320 may be individually disposed at a position facing the second surface C2 of a different solar cell C.

Figure 8:
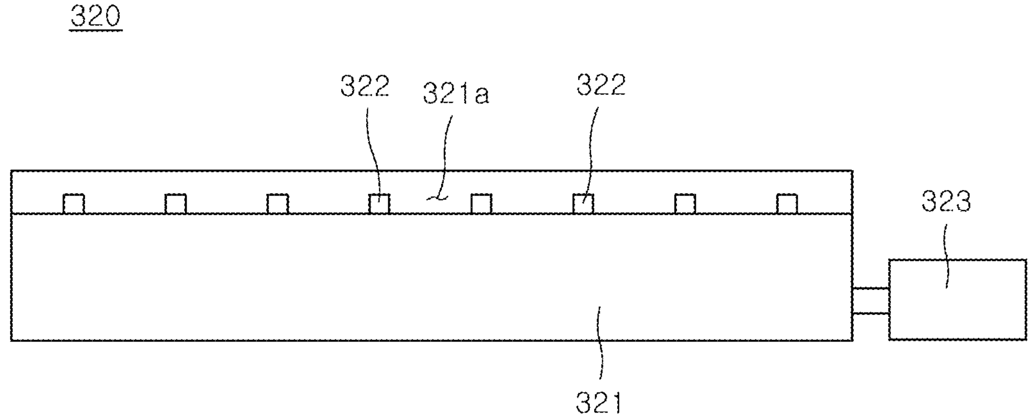
FIG. 8 is a schematic side view illustrating a configuration of a second pressing member according to one embodiment of the present disclosure.
Figure 9:
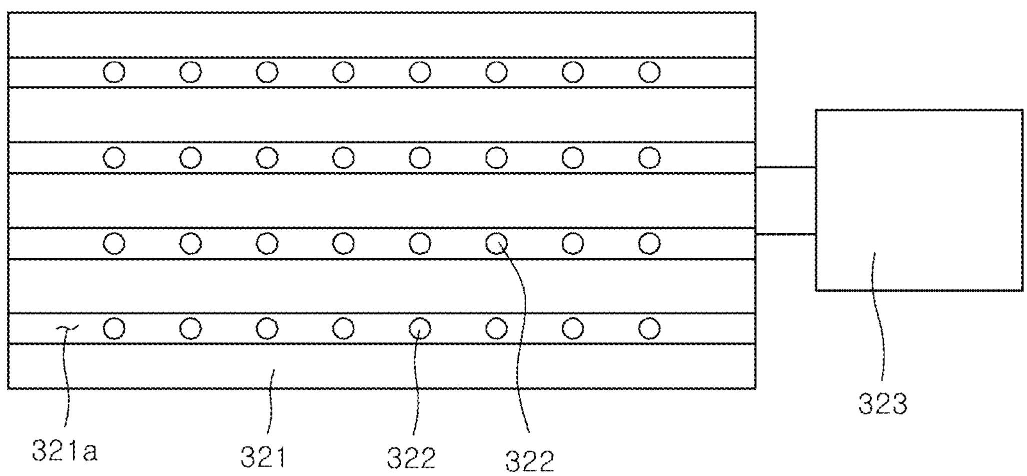
FIG. 9 is a schematic plan view illustrating the configuration of the second pressing member according to one embodiment of the present disclosure.
Figure 10:
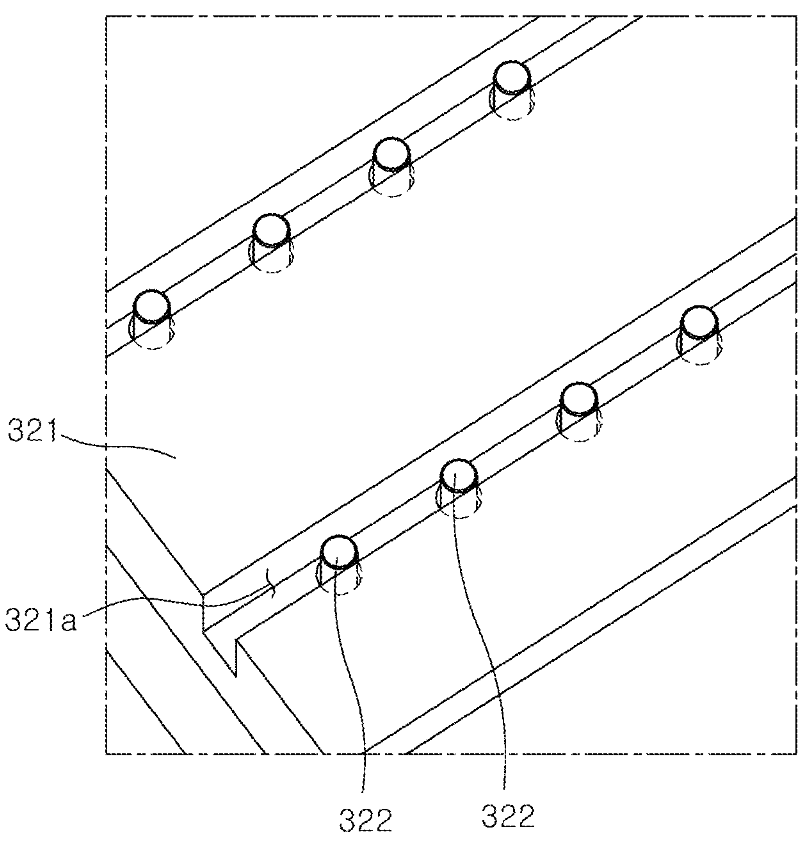
FIG. 10 is a schematic perspective view illustrating the configuration of the second pressing member according to one embodiment of the present disclosure.

FIG. 8 is a schematic side view illustrating a configuration of a second pressing member according to one embodiment of the present disclosure, FIG. 9 is a schematic plan view illustrating the configuration of the second pressing member according to one embodiment of the present disclosure, and FIG. 10 is a schematic perspective view illustrating the configuration of the second pressing member according to one embodiment of the present disclosure.

Referring to FIGS. 1 to 10, the second pressing member 320 according to the present embodiment may include a second pressing body 321 and a second pressing pin 322.

The second pressing body 321 may form an approximate exterior of the second pressing member 320 and support the second pressing pin 322.

The second pressing body 321 according to the present embodiment may be disposed to face the second surface C2 of the solar cell C. The second pressing body 321 may be in contact with the second surface C2 of the solar cell C. Accordingly, when the transfer member 120 moves in the direction opposite to the second direction, the second pressing body 321 may maintain the second surface C2 of the solar cell C in a state of being separated from the transfer member 120. When the transfer member 120 moves in the second direction, the transfer member 120 may come into contact with the second surface C2 at the same position as the surface of the second pressing body 321, which faces the second surface C2. However, the transfer member 120 is not limited thereto and may also come into contact with the second surface C2 at a position higher than one surface of the second pressing body 321, which faces the second surface C2. In this case, during the operation of the transfer member 120, the second pressing body 321 may be repeatedly brought into contact with and separated from the second surface C2 of the solar cell C.

An insertion groove 321*a* may be formed in the second pressing body 321. The insertion groove 321*a* according to the present embodiment may have a groove shape which is concavely formed inward from the one surface of the second pressing body 321, which faces the second surface C2 of the solar cell C, to the inside of the second pressing body 321 in the direction opposite to the second direction. A longitudinal direction of the insertion groove 321*a* may be disposed parallel to the first direction. The insertion groove 321*a* may be disposed to face the second portion W2 of the wire W seated on the second surface C2 of the solar cell C. When the second surface C2 of the solar cell C comes into contact with the second pressing body 321, the second portion W2 of the wire W may be inserted into the insertion groove 321*a*.

The insertion groove 321*a* may be provided as a plurality of insertion grooves. The plurality of insertion grooves 321*a* may be arranged in the third direction. Each insertion groove 321*a* may be individually disposed to face the second portions W2 of the plurality of wires W disposed in parallel in the third direction on the second surface C2 of the solar cell C.

The second pressing pin 322 may be connected to the second pressing body 321 and may press the second portion W2 of the wire W toward the second surface C2 of the solar cell C.

The second pressing pin 322 according to the present embodiment may have a rod shape protruding from the second pressing body 321 toward the second surface C2 of the solar cell C. A cross-sectional shape of the second pressing pin 322 may have various shapes such as a circle, an oval, a polygon, an irregular shape, and the like. A longitudinal direction of the second pressing pin 322 may be disposed parallel to the second direction. An end portion of the second pressing pin 322 may be in contact with the second portion W2 of the wire W, which faces the second surface C2 of the solar cell C. The second pressing pin 322 may press the second portion W2 of the wire W toward the second surface C2 of the solar cell C, that is, in the second direction, by a reaction force due to the pressing force applied from the first pressing member 310.

The second pressing pin 322 may be disposed inside the insertion groove 321*a*. The end portion of the second pressing pin 322 may not protrude outward from the second pressing body 321 and may be located inside the insertion groove 321*a*. Accordingly, the second pressing pin 322 may maintain the contact with the second portion W2 of the wire W and guide the second surface C2 of the solar cell C to be seated on the second pressing body 321.

A material of the second pressing pin 322 may include a ceramic having insulating properties. For example, the second pressing pin 322 may be entirely made of a ceramic. However, the second pressing pin 322 is not limited thereto and may be formed in a form in which only an end portion that comes into contact with the second portion W2 of the wire W is made of a ceramic or in a form in which a surface is coated with a ceramic. Accordingly, the second pressing pin 322 can prevent the wire W from being fused on the surface by heat applied from the bonding device 20.

An example in which the first pressing pin 312 and the second pressing pin 322 are both made of a ceramic has been described above, but the present disclosure is not limited thereto, and only one of the first pressing pin 312 and the second pressing pin 322 may be made of a ceramic.

The second pressing pin 322 may be provided as a plurality of second pressing pins. The plurality of second pressing pins 322 may individually press different positions of the second portion W2 of the wire W.

For example, the plurality of second pressing pins 322 may be arranged in two or more rows in an extending direction of the second portion W2, that is, the first direction. Accordingly, the plurality of second pressing pins 322 may firmly bring the second portion W2 of one wire W into close contact with the second surface C2 of the solar cell C.

The plurality of second pressing pins 322 may be arranged in two or more rows in a direction intersecting the extending direction of the second portion W2, that is, the third direction. Accordingly, the plurality of second pressing pins 322 may uniformly press the plurality of wires W disposed in parallel on the second surface C2 of the solar cell C.

The number and arrangement of plurality of first pressing pins 312 are not limited to those illustrated in FIGS. 4 and 5 and may be designed to vary depending on the size of the solar cell C, the number of wires W, and the like.

The second pressing pin 322 may be disposed to face the first pressing pin 312 with the solar cell C and the wire W interposed therebetween. For example, as illustrated in FIGS. 3 and 4, a central axis of each second pressing pin 322 may be disposed coaxially with a central axis of a different first pressing pin 312 in the second direction.

Figure 11:
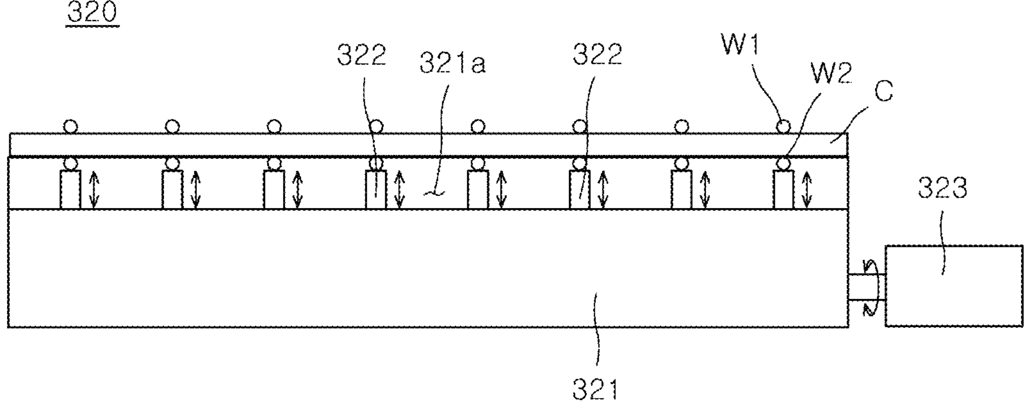
FIG. 11 is a schematic view illustrating an operation state of the second pressing member according to one embodiment of the present disclosure.

FIG. 11 is a schematic view illustrating an operation state of the second pressing member according to one embodiment of the present disclosure.

Referring to FIG. 11, the second pressing pin 322 may be movably connected to the second pressing body 321. The second pressing pin 322 may be brought into contact with or separated from the second portion W2 depending on the movement direction. Accordingly, the second pressing pin 322 may be flexibly applied to wires W having various diameters, and the magnitude of the pressing force applied to the wire W may be actively adjusted. In addition, the second pressing pin 322 may be separated from the wire W when the solar cell C and the wire W are transferred by the transfer line 10 to induce smooth movement of the solar cell C and the wire W.

The second pressing member 320 according to the present embodiment may further include a pressing driving unit 323.

The pressing driving unit 323 may be connected to the second pressing pin 322 and may serve as a component for controlling the movement direction of the second pressing pin 322. The pressing driving unit 323 according to the present embodiment may include an actuator such as an electric motor or a cylinder for generating a driving force, and a power transmission device for moving the second pressing pin 322 in the second direction or in the direction opposite to the second direction by a driving force generated by the actuator. The power transmission device may include various types of power transmission means for moving the second pressing pin 322 in the direction parallel to the second direction by the driving force generated by the actuator such as a cam follower, a ball screw, or the like.

The pressing driving unit 323 may be connected to a plurality of second pressing pins 322 and may simultaneously move the plurality of second pressing pins 322 in the second direction or in the direction opposite to the second direction. Alternatively, the pressing driving unit 323 may be provided as a plurality of pressing driving units and individually connected to a different second pressing pin 322.

Hereinafter, a tabbing apparatus according to another embodiment of the present disclosure will be described.

The tabbing apparatus according to the present embodiment may be configured to differ only in the detailed configuration of the pressing device 30 from the tabbing apparatus according to one embodiment of the present disclosure.

Accordingly, in describing the tabbing apparatus according to the present embodiment, only the detailed configuration of the pressing device 30, which differs from that of the tabbing apparatus according to one embodiment of the present disclosure, will be described. The description of the tabbing apparatus according to one embodiment of the present disclosure may be applied as is to the remaining components of the tabbing apparatus according to the present embodiment.

Figure 12:
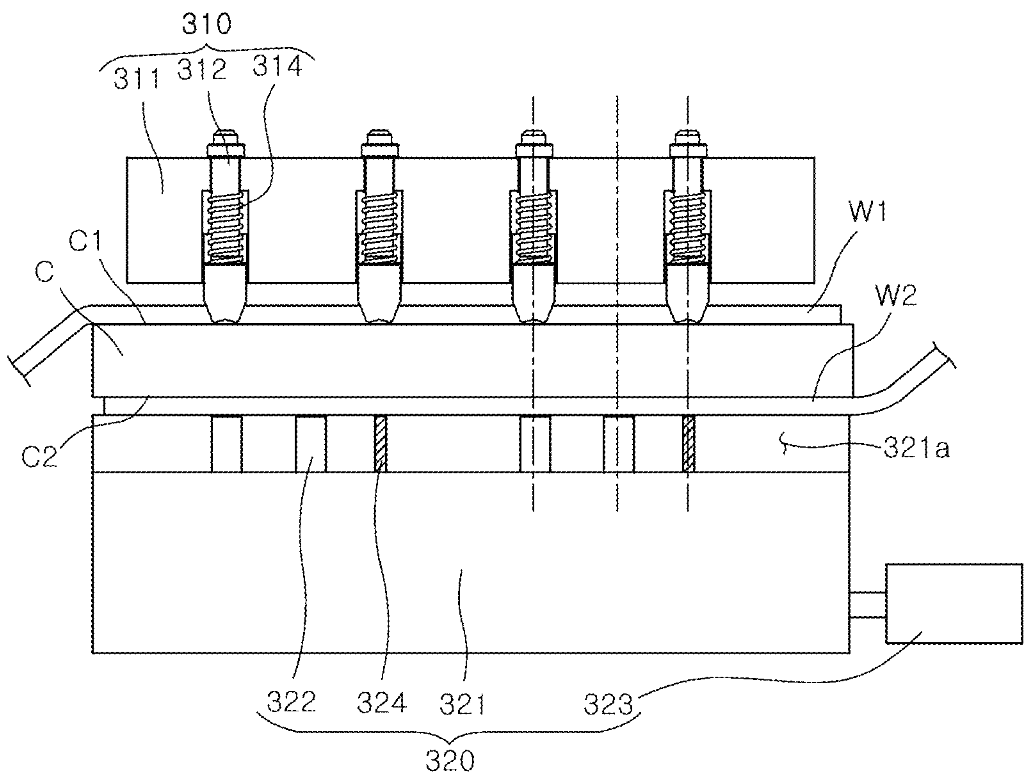
FIG. 12 is a schematic side cross-sectional view illustrating a configuration of a pressing device according to another embodiment of the present disclosure.
Figure 12:
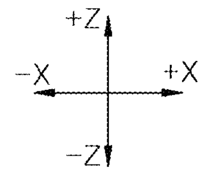
Figure 13:
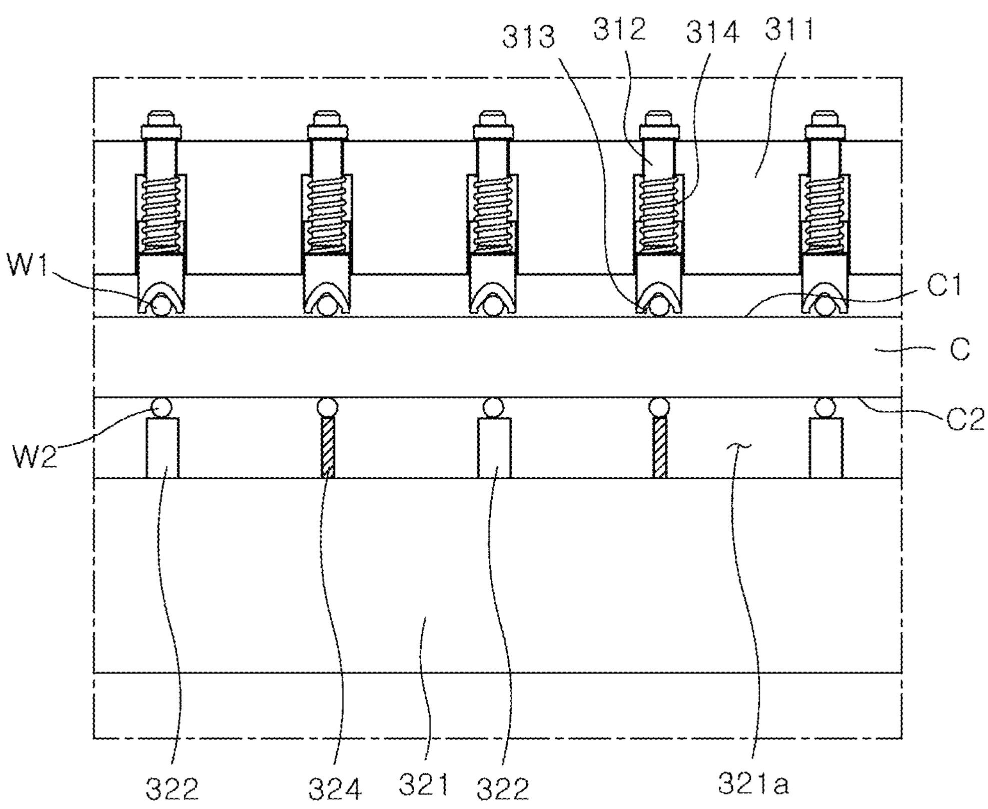
FIG. 13 is a schematic front cross-sectional view illustrating the configuration of the pressing device according to another embodiment of the present disclosure.
Figure 13:
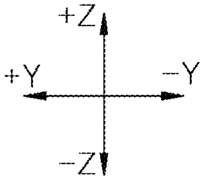

FIG. 12 is a schematic side cross-sectional view illustrating a configuration of a pressing device according to another embodiment of the present disclosure, and FIG. 13 is a schematic front cross-sectional view illustrating the configuration of the pressing device according to another embodiment of the present disclosure.

Referring to FIGS. 12 and 13, at least one of the plurality of second pressing pins 322 according to the present embodiment may be disposed to be misaligned with the first pressing pin 312.

Hereinafter, an example in which some of the plurality of second pressing pins 322 are disposed to be misaligned with the first pressing pin 312 and the others are disposed to face the first pressing pin 312 will be described. However, the present disclosure is not limited thereto, and all of the plurality of second pressing pins 322 may be disposed to be misaligned with the first pressing pin 312.

For example, as illustrated in FIG. 12, the first pressing pin 312 may not be positioned on extending lines of center axes of some of the plurality of second pressing pins 322. Likewise, the second pressing pin 322 may not be positioned on extending lines of center axes of some of the plurality of first pressing pins 312.

Figures 14, 15:
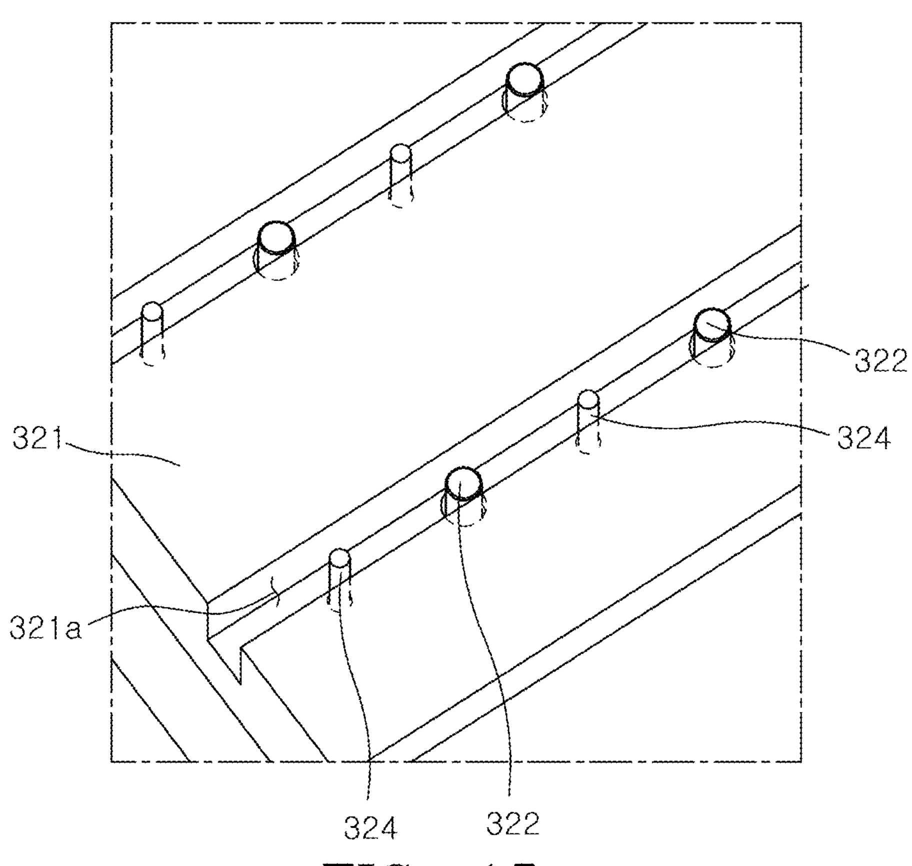
FIG. 14 is a schematic perspective view illustrating a configuration of a second pressing member according to another embodiment of the present disclosure.
FIG. 15 is a schematic plan view illustrating the configuration of the second pressing member according to another embodiment of the present disclosure.

FIG. 14 is a schematic perspective view illustrating a configuration of a second pressing member according to another embodiment of the present disclosure, and FIG. 15 is a schematic plan view illustrating the configuration of the second pressing member according to another embodiment of the present disclosure.

Referring to FIGS. 12 to 15, the second pressing member 320 according to the present embodiment may further include a support pin 324.

The support pin 324 may be disposed to face the first pressing pin 312 disposed to be misaligned with the second pressing pin 322 among the plurality of first pressing pins 312. The support pin 324 may serve as a component for supporting the pressing force applied from the first pressing pin 312. Accordingly, the support pin 324 can prevent the solar cell C or the wire W from being deformed or damaged by the pressing force applied from the first pressing pin 312 disposed to be misaligned with the second pressing pin 322 among the plurality of first pressing pins 312.

The support pin 324 according to the present embodiment may have a rod shape protruding from the second pressing body 321 toward the second surface C2 of the solar cell C. A cross-sectional shape of the support pin 324 may have various shapes such as a circle, an oval, a polygon, an irregular shape, and the like. A longitudinal direction of the support pin 324 may be disposed parallel to the second direction. A central axis of the support pin 324 may be disposed coaxially with the central axis of the first pressing pin 312 disposed to be misaligned with the second pressing pin 322 among the plurality of first pressing pins 312 in the second direction. An end portion of the support pin 324 may be in contact with the second portion W2 of the wire W, which faces the second surface C2 of the solar cell C.

The support pin 324 may be disposed inside the insertion groove 321*a*. The end portion of the support pin 324 may not protrude outward from the second pressing body 321 and may be located inside the insertion groove 321*a*.

A material of the support pin 324 may include a ceramic having insulating properties. For example, the support pin 324 may be entirely made of a ceramic. However, the support pin 324 is not limited thereto and may be formed in a form in which only an end portion in contact with the second portion W2 of the wire W is made of a ceramic or in a form in which a surface is coated with a ceramic. Accordingly, the support pin 324 can prevent the wire W from being fused on the surface by heat applied from the bonding device 20.

A cross-sectional area of the support pin 324 may be smaller than a cross-sectional area of the second pressing pin 322. Accordingly, a contact area of the support pin 324 with the second portion W2 of the wire W may be relatively reduced, and the wire W can be prevented from being fused on the surface of the support pin 324. FIGS. 14 and 15 illustrate that the entire cross-sectional area of the support pin 324 is smaller than the cross-sectional area of the second pressing pin 322, but the support pin 324 is not limited thereto and may be formed so that only a cross-sectional area of a part substantially in contact with the second portion W2 of the wire W, that is, an end surface, is smaller than the cross-sectional area of the second pressing pin 322.

The support pin 324 may be provided as a plurality of support pins. The plurality of support pins 324 may each be disposed at a position individually facing a different first pressing pin 312 disposed to be misaligned with the second pressing pin 322.

Hereinafter, a tabbing apparatus according to still another embodiment of the present disclosure will be described.

Figure 16:
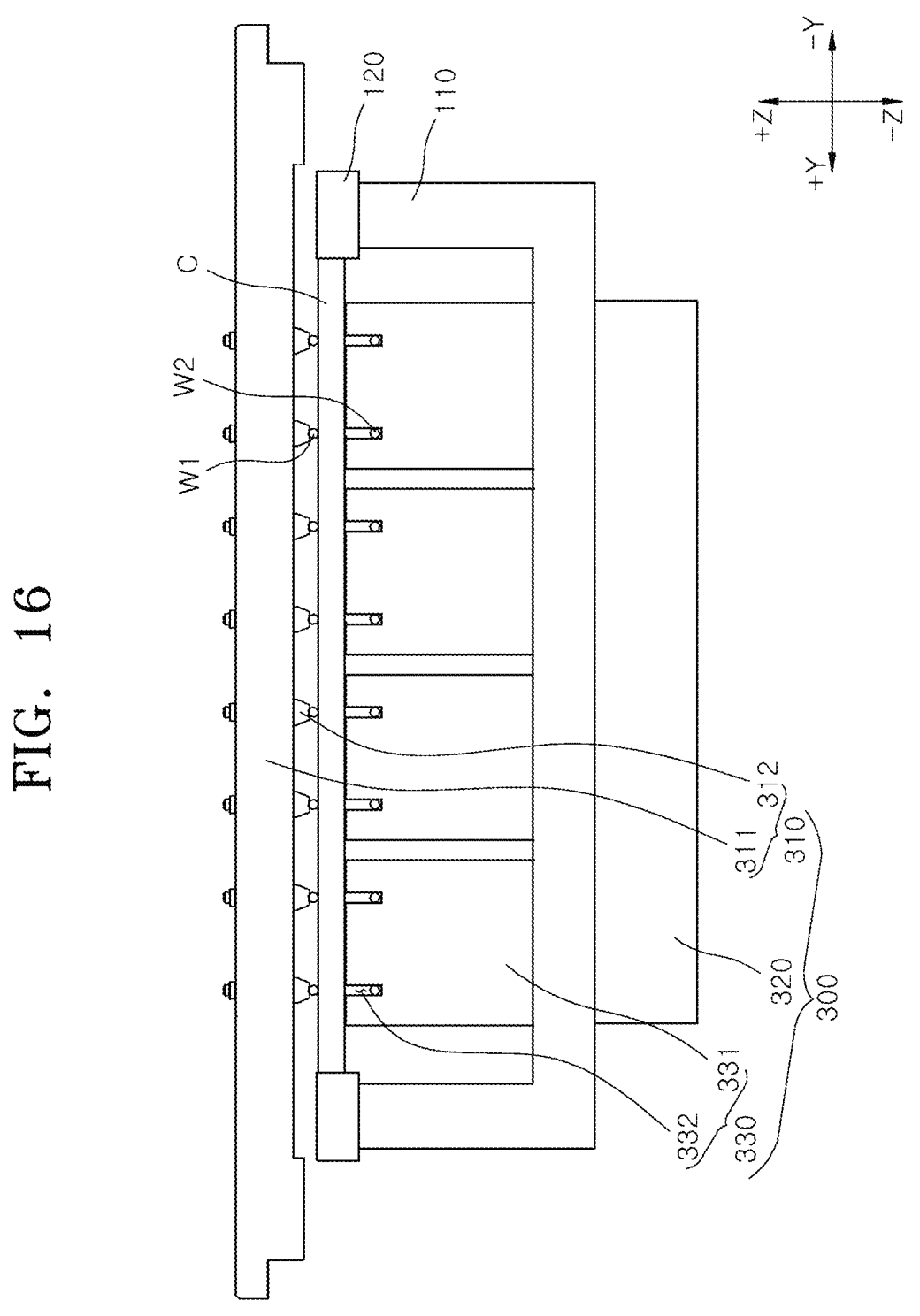
Figure 17:
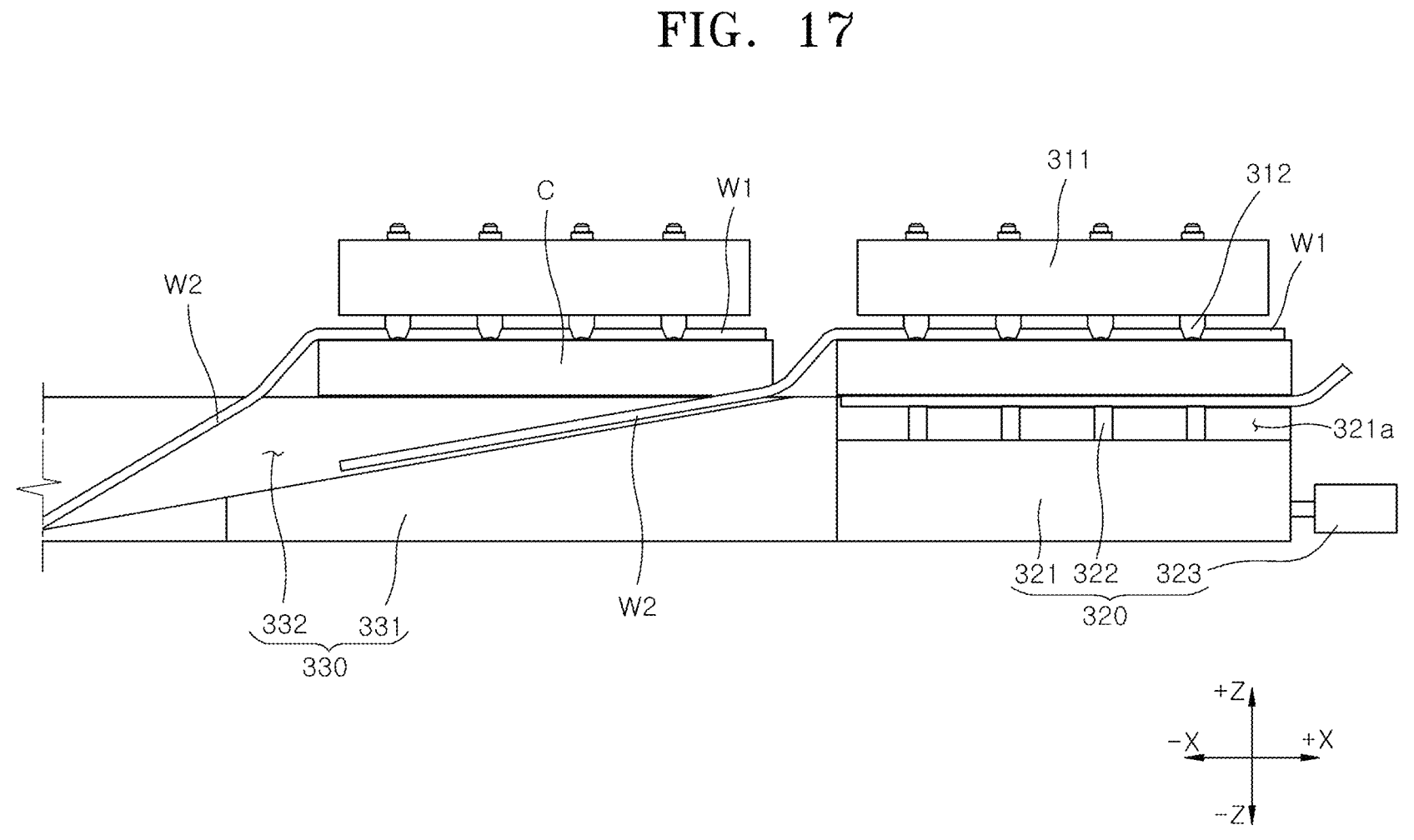

FIG. 16 is a schematic front cross-sectional view illustrating a configuration of a tabbing apparatus according to still another embodiment of the present disclosure, and FIG. 17 is a schematic side cross-sectional view illustrating the configuration of the tabbing apparatus according to still another embodiment of the present disclosure.

Referring to FIGS. 16 and 17, the tabbing apparatus according to the present embodiment may further include a third pressing member 330.

The tabbing apparatus according to the present embodiment may be configured to differ from the tabbing apparatuses according to the above embodiments only in that it further includes the third pressing member 330.

Accordingly, in describing the tabbing apparatus according to the present embodiment, only the third pressing member 330 which is not described in the tabbing apparatuses according to the above embodiments will be described. The description of the tabbing apparatus according to each embodiment of the present disclosure may be applied as is to the remaining components of the tabbing apparatus according to the present embodiment.

The third pressing member 330 may press the second portion W2 of the wire W toward the second surface C2 of the solar cell C in conjunction with the transfer of the solar cell C. More specifically, when the solar cell C and the wire W are transferred by the transfer line 10 before the operation of the bonding device 20, no separate pressing force is applied to the second portion W2 of the wire W in an area in which the second pressing member 320 is not disposed. Accordingly, there is a concern that the second portion W2 of the wire W is not positionally fixed on the second surface C2 of the solar cell C and will be deformed due to interference with an adjacent part. Accordingly, the third pressing member 330 may serve as a component for preliminarily pressing the second portion W2 toward the second surface C2 earlier than the second pressing member 320 during the transfer process of the solar cell C and the wire W to align the relative position of the second portion W2 with respect to the second surface C2.

The third pressing member 330 according to the present embodiment may include a third pressing body 331 and a guide groove 332.

The third pressing body 331 may form an approximate exterior of the third pressing member 330. The third pressing body 331 according to the present embodiment may extend from the second pressing member 320 in the direction opposite to the first direction. The third pressing body 331 may be fixed to the second pressing body 321 or alternatively, may be fixed to a separate frame (not illustrated). The third pressing body 331 may extend from the second pressing member 320 to a starting point of the transfer line 10, that is, a section in which the solar cell C and the wire W are transferred from the outside to the transfer line 10.

The third pressing body 331 may be disposed to be spaced apart from the second surface C2 of the solar cell C in the direction opposite to the second direction. One surface of the third pressing body 331 may be disposed to face the second portion W2 of the wire W.

The third pressing body 331 may be provided as a plurality of third pressing bodies. The plurality of third pressing bodies 331 may be arranged in the third direction and disposed to face the second portions W2 of the wires W disposed in parallel in the third direction.

The guide groove 332 may have a groove shape which is concavely formed from one surface of the third pressing body 331, which faces the second portion W2, inward of the third pressing body 331. A longitudinal direction of the guide groove 332 may be disposed parallel to the first direction. One end portion of the guide groove 332, which is disposed to face the second pressing member 320 may communicate with one end portion of the insertion groove 321*a* formed in the second pressing body 321. The second portion W2 of the wire W may be inserted into the guide groove 332. Accordingly, the guide groove 332 can prevent the second portion W2 from moving in the direction intersecting the first direction and prevent the second portion W2 from interfering with an adjacent part.

The depth of the guide groove 332 concavely formed inward of the third pressing body 331 may be formed to gradually decrease in the first direction. That is, a bottom surface of the guide groove 332 may be inclined in the second direction in the first direction. Accordingly, the guide groove 332 may gradually press the second portion W toward the second surface C2 when the solar cell C and the wire W are transferred in the first direction by the transfer line 10.

Figure 18:
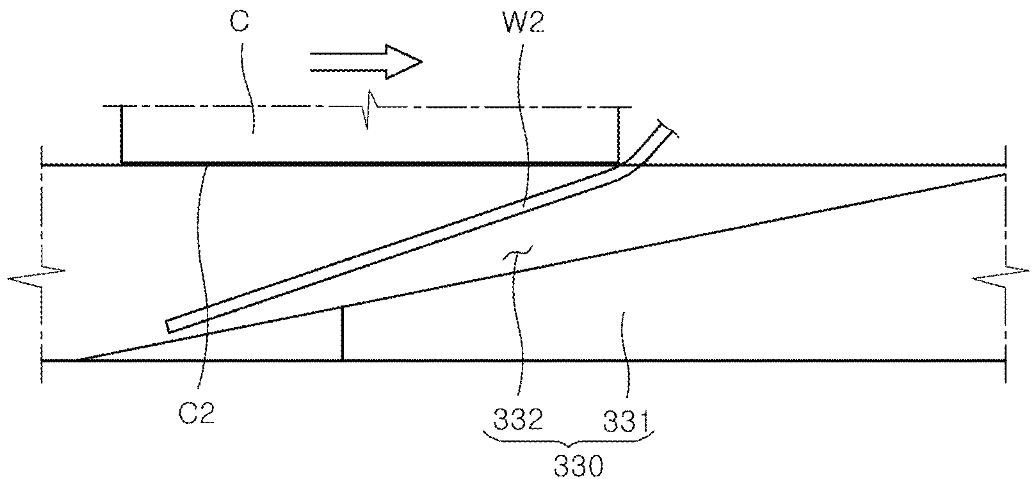
FIGS. 18 and 19 are schematic views illustrating a configuration of a third pressing member according to still another embodiment of the present disclosure.
Figure 19:
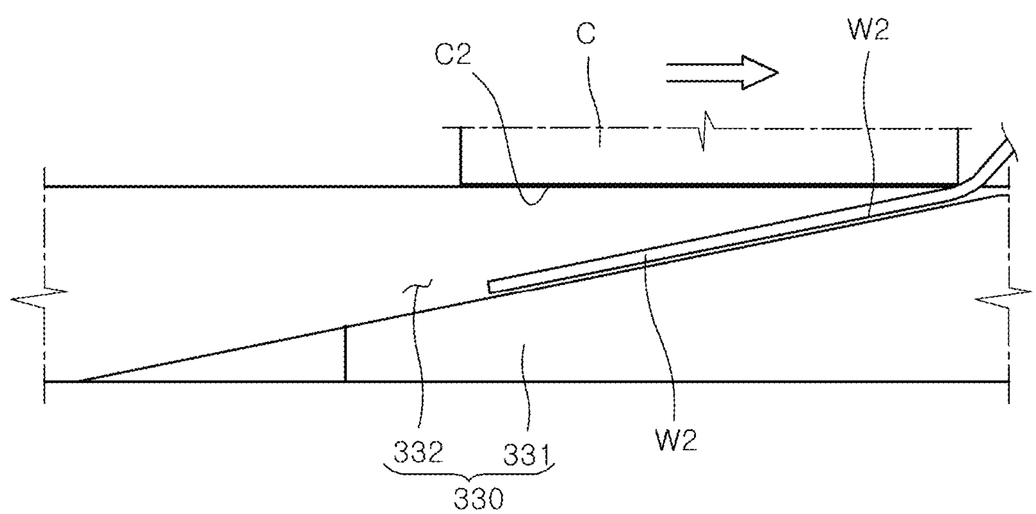

FIGS. 18 and 19 are schematic views illustrating a configuration of a third pressing member according to still another embodiment of the present disclosure.

Referring to FIGS. 18 and 19, during the process of the solar cell C and the wire W being transferred in the first direction by the transfer line 10, the second portion W2 of the wire W enters the guide groove 332 through an end portion of the third pressing body 331.

Thereafter, as the solar cell C and the wire W move in the first direction, the second portion W2 of the wire W comes into contact with the bottom surface of the guide groove 332, and a pressing force is applied to the second portion W2 of the wire W in the direction toward the second surface C2, that is, the second direction.

As the depth of the guide groove 332 gradually decreases in the first direction, the magnitude of the pressing force applied to the second portion W2 of the wire W gradually increases, and the second portion W2 moves in a direction closer to the second surface C2.

Thereafter, as the solar cell C moves onto the second pressing body 321, the second portion W2 is inserted into the insertion groove 321*a*.

According to the present disclosure, since a wire can be firmly fixed to both surfaces of a solar cell during a process of bonding the solar cell and the wire, it is possible to improve bonding quality.

According to the present disclosure, since a first pressing pin is movably connected to a first pressing body and elastically supported by an elastic member, it is possible to mitigate an impact generated during a contact process of the wire.

According to the present disclosure, since a second pressing pin selectively comes into contact with the wire, the second pressing pin can be applied to wires having various diameters, and the magnitude of a pressing force applied to the wire can be actively adjusted.

According to the present disclosure, since a material of at least one of the first pressing pin and the second pressing pin includes a ceramic, it is possible to prevent the wire from being fused to surfaces of the first pressing pin and the second pressing pin.

According to the present disclosure, it is possible to prevent the solar cell or the wire from being deformed or damaged by a pressing force applied from the first pressing pin disposed to be misaligned with the second pressing pin among the plurality of first pressing pins by a support pin.

Although the present disclosure has been described with reference to embodiments illustrated in the drawings, the embodiments are merely illustrative, and those skilled in the art will understand that various modifications and equivalent other embodiments are possible therefrom.

Accordingly, the technical scope of the present disclosure should be determined by the appended claims.

What is claimed is:

1. A pressing device comprising:

a first pressing member configured to press a first portion of a wire seated on a first surface of a solar cell; and a second pressing member spaced apart from the first pressing member and configured to press a second portion of the wire seated on a second surface opposite to the first surface, wherein the first pressing member includes, a first pressing body disposed to face the first surface; and a first pressing pin connected to the first pressing body and configured to press the first portion toward the first surface, wherein the second pressing member includes, a second pressing body disposed to face the second surface; and a second pressing pin connected to the second pressing body and configured to press the second portion toward the second surface, wherein the second pressing pin is disposed to be misaligned with the first pressing pin, and wherein the second pressing member further includes a support pin disposed to face the first pressing pin.

2. The pressing device of claim 1, wherein the first pressing member further includes a pressing groove which is concavely formed inward of the first pressing pin and into which the first portion is inserted.

3. The pressing device of claim 2, wherein a width of the pressing groove increases toward the first surface.

4. The pressing device of claim 1, wherein the first pressing pin is movably connected to the first pressing body.

5. The pressing device of claim 4, wherein the first pressing member further includes an elastic member configured to elastically support the first pressing pin with respect to the first pressing body.

6. The pressing device of claim 1, wherein a material of one of the first pressing pin and the second pressing pin includes a ceramic.

7. The pressing device of claim 1, wherein a cross-sectional area of the support pin is smaller than a cross-sectional area of the second pressing pin.

8. The pressing device of claim 1, wherein the first pressing pin and the second pressing pin are provided as a plurality of first pressing pins and a plurality of second pressing pins, and at least one of the plurality of second pressing pins is disposed to be misaligned with the first pressing pin.

9. The pressing device of claim 1, wherein the second pressing pin is movably connected to the second pressing body and is brought into contact with or separated from the second portion according to a movement direction.

10. The pressing device of claim 9, wherein the second pressing member further includes a pressing driving unit which is connected to the second pressing pin and controls the movement direction of the second pressing pin.

11. The pressing device of claim 1, wherein the solar cell is transferred to the second pressing member in a first direction parallel to an extending direction of the wire, and the pressing device further includes a third pressing member configured to press the second portion toward the second surface in conjunction with the transfer of the solar cell.

12. The pressing device of claim 11, wherein the third pressing member includes:

a third pressing body spaced apart from the second pressing member in a direction opposite to the first direction and disposed to face the second portion; and a guide groove which is concavely formed inward of the third pressing body and disposed parallel to the first direction and into which the second portion is inserted.

13. The pressing device of claim 12, wherein a depth of the guide groove decreases in the first direction.

14. A tabbing apparatus comprising:

a transfer line configured to transfer a solar cell;

a bonding device configured to bond the solar cell transferred by the transfer line and a wire seated on the solar cell; and a pressing device according to claim 1.

* * * * *